United States Patent [19]

Stellrecht

[11] Patent Number: 5,342,496
[45] Date of Patent: Aug. 30, 1994

[54] METHOD OF WELDING SPUTTERING TARGET/BACKING PLATE ASSEMBLIES

[75] Inventor: David E. Stellrecht, Columbus, Ohio

[73] Assignee: Tosoh SMD, Inc., Grove City, Ohio

[21] Appl. No.: 63,521

[22] Filed: May 18, 1993

[51] Int. Cl.⁵ .............................................. C23C 14/34
[52] U.S. Cl. ........................... 204/298.12; 204/298.13; 228/114.5
[58] Field of Search .................. 204/298.12, 298.13, 204/298.18; 228/114.5

[56] References Cited

U.S. PATENT DOCUMENTS

| | | | |
|---|---|---|---|
| 3,452,421 | 7/1969 | Chin et al. | 228/114.5 |
| 3,693,238 | 9/1972 | Hoch et al. | 228/113 |
| 3,998,373 | 12/1976 | Jones et al. | 228/2.3 |
| 4,341,816 | 7/1982 | Lauterbach et al. | 427/456 |
| 4,385,979 | 5/1983 | Pierce et al. | 204/298.09 |
| 4,457,825 | 7/1984 | Lamont, Jr. | 204/298.12 |
| 4,476,151 | 10/1984 | Keller | 204/298.12 |
| 4,752,335 | 6/1988 | Korb | 75/249 |
| 5,009,765 | 4/1991 | Qamar et al. | 204/298.12 |
| 5,032,468 | 7/1991 | Dumont et al. | 428/636 |
| 5,087,297 | 2/1992 | Poliquen | 148/691 |
| 5,143,590 | 9/1992 | Strothers et al. | 204/298.12 |
| 5,215,639 | 6/1993 | Boys | 204/192.12 |
| 5,230,459 | 7/1993 | Mueller et al. | 228/164 |
| 5,282,943 | 2/1994 | Lannutti et al. | 204/192.12 |

FOREIGN PATENT DOCUMENTS

| | | | |
|---|---|---|---|
| 0500031A1 | 8/1992 | European Pat. Off. | 204/298.12 |
| 63-270459 | 11/1988 | Japan | 204/298.12 |
| 1-283367 | 11/1989 | Japan | 204/298.12 |
| 1-283368 | 11/1989 | Japan | 204/298.12 |

*Primary Examiner*—Aaron Weisstuch
*Attorney, Agent, or Firm*—Biebel & French

[57] ABSTRACT

Methods of preparing a sputter target or a sputter target/backing plate assembly and assemblies so prepared are disclosed. The methods comprise forming a friction weld joint consisting of a horizontal surface, an angled surface, a curved surface or any combination of the preceding. The target is rotated in the collet of a friction welding machine and the base or backing plate forced against the target to form the weld.

21 Claims, 5 Drawing Sheets

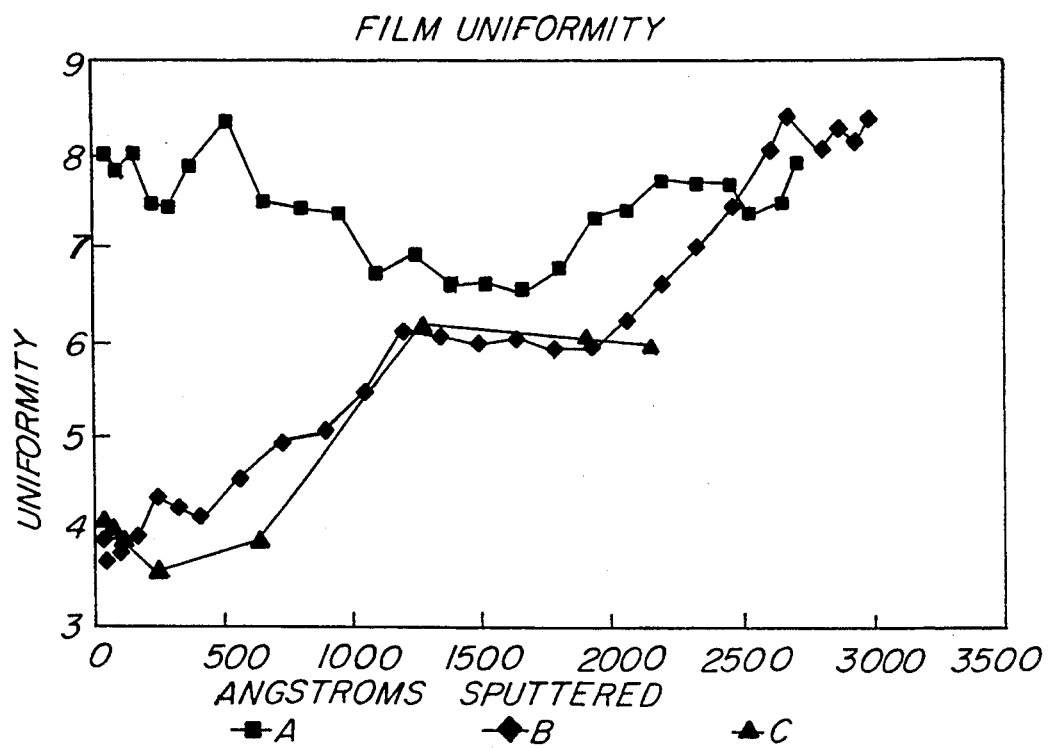
FIG-5 FILM UNIFORMITY
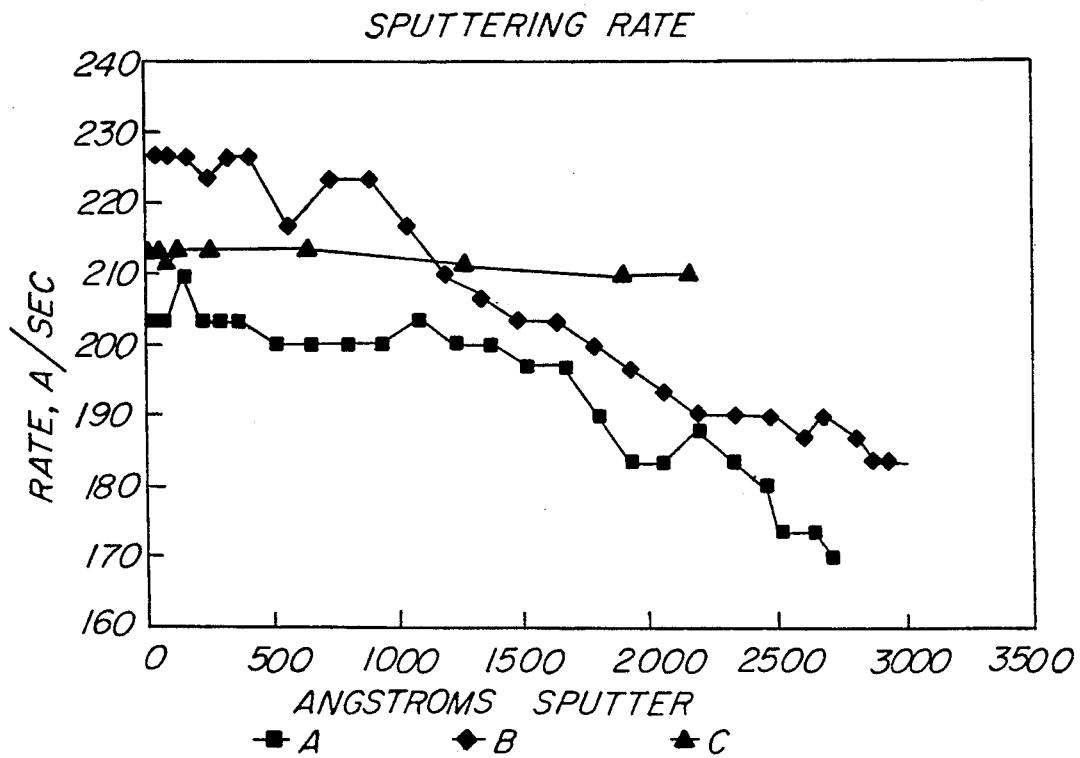
FIG-6 SPUTTERING RATE

METHOD OF WELDING SPUTTERING TARGET/BACKING PLATE ASSEMBLIES

FIELD OF THE INVENTION

This application pertains to a method of welding together components of sputtering targets or sputtering target/backing plate assemblies. More specifically, it relates to friction weld bonding of a target to its corresponding backing plate.

BACKGROUND OF THE INVENTION

Cathodic sputtering is widely used for the deposition of thin layers of material onto desired substrates. Basically, this process requires a gas ion bombardment of the target having a face formed of a desired material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target surface thereby increasing the number of electron-gas atom collisions in the area to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway.

In conventional target cathode assemblies, the target is attached to a nonmagnetic backing plate. The backing plate is normally water-cooled to carry away the heat generated by the ion bombardment of the target. Magnets are typically arranged beneath the backing plate in well-known dispositions in order to form the above-noted magnetic field in the form of a loop or tunnel extending around the exposed face of the target.

In order to achieve good thermal and electrical contact between the target and the backing plate, these members are commonly attached to each other by use of soldering, brazing, diffusion bonding, clamping, epoxy cements, etc.

Some sputtering systems use targets that are not bonded to the water cooling assembly. Instead they fit into a water jacket of a water cooling assembly with a close tolerance. When sputtering starts, these targets heat up and expand to contact the water cooling assembly and are cooled for further sputtering so that the temperature of the sputtering target does not increase significantly. This method works well for target materials that are reasonably strong.

Some sputtering target materials are very weak or have very low yield strength. Pure aluminum is an example. When pure aluminum expands against the water cooling assembly, it is so weak that it deforms and shrinks during sputtering. As it gets smaller, it runs hotter and hotter, resulting in poorer sputter performance. Making these targets stronger would be very desirable, but when pure aluminum is required for the sputtering material, no alloy elements can be added to strengthen the material.

In U.S. Pat. No. 4,385,979 (Pierce et al) fragile sputter target materials are provided with a retaining cup or band member (see FIGS. 3a-3c) and a bonding means between the target and retaining cup or band. The retaining member helps to alleviate target warping, cracking and/or overheating problems that may otherwise occur upon usage. The present invention provides improvement in methods of fabricating target/retainer cup or band assemblies of the type shown in Pierce et al.

TiG welding of a target to a backing plate structure is disclosed in U.S. Pat. No. 5,009,765 (Qamar et al—of common assignment herewith), although the target disclosed in this patent is not cooled via expansion of the target sidewall into a surrounding water jacket but rather is cooled by direct impingement of cooling water on the bottom surface of the target.

Roll bonding of a target to a backing plate is disclosed in U.S. Pat. No. 5,032,468 (Dumont et al) with the patent to Korb, U.S. Pat. No. 4,752,335 teaching target manufacturing methods involving cold pressing of the requisite powders followed by densification of the material by repeated working at temperatures below the lowest of the melting points of the individual components. This treatment occurs under conditions of material flow and cold welding.

The Pouliquen U.S. Pat. No. 5,087,297 discloses forging of a target to develop a desired grain for subsequent use in magnetron sputtering.

Other patents which are generally of interest to the field of friction welding, but not cathodic sputtering include U.S. Pat. No. 3,693,238 (Hoch et al); U.S. Pat. No. 3,452,421 (Cheng et al) and U.S. Pat. No. 3,998,373 (Jones et al). Of background interest to sputtering procedures and structures with specific reference to magnetron sputtering, U.S. Pat. No. 4,457,825 (Lamont, Jr.) is mentioned.

SUMMARY OF THE INVENTION

In order to improve thermal expansion and cooling properties of such targets, a retainer cup or band is friction welded onto the bottom side of the fragile target material. The target with welded retainer cup or band is then fitted into a cathodic sputter device of the type providing for water cooling of the target via interfacial contact of the target sidewall with a surrounding water jacket or the like. Such devices are, for example, shown in U.S. Pat. No. 4,385,979 (Pierce et al.), herein incorporated by reference.

The base or backing plate in the assembly may, in some cases, be less costly than the sputtering target material and reduce the cost of the assembly below that of a monolithic assembly of all sputtering target material. In other cases, the base or backing plate material may be stronger than the target, thereby providing enhanced structural integrity to the assembly.

Friction welding is a process to join two pieces of material in which one piece is clamped in a collet or chuck of a friction welding lathe and the other piece is clamped in the non-rotating tailstock. The collet or chuck is then rotated to a predetermined speed and the material in the tailstock is pressed against the material in the collet or chuck with a predetermined force. The friction energy of this process is sufficient to melt a layer of both materials and weld the two together as the rotation of the collet or chuck is stopped.

Machines used for friction welding may be either inertial type or clutch drive. Inertial machines have flywheel weights attached to the collet or chuck so that the initial rotational speed represents the total energy needed to make the weld. Clutch drive machines must have sufficient power to make the weld and a capability of reducing the torque at the rate required to make a good weld. Either machine must be capable of varying the force used to press the parts together as necessary.

This method can make welds that are perpendicular to the axis of rotation of the moving workpiece, but is not limited to this geometry. Welds may be made at angles and may also be made with more than one angle machined into the weld joint. Such welds which do not have a straight interface are much more difficult to make by other methods.

Details of friction welding need not be repeated herein and can be seen upon review of aforementioned U.S. Pat. Nos. 3,452,421; 3,693,238; and 3,998,376. These patents are incorporated by reference herein to supplement the instant disclosure.

The invention will be further described in conjunction with the drawings and following detailed description.

In the drawings:

DESCRIPTION OF THE DRAWINGS

FIG. 5 is a graph showing comparison in sputtered film uniformity of films resulting from sputtering of a friction welded target/retainer cup in accordance with the invention with those resulting from conventional one piece sputter targets; and FIG. 6 is a graph comparing sputtering rates from a friction welded target/retainer cup in accordance with the invention with those resulting from conventional one piece sputter targets.

DETAILED DESCRIPTION OF THE PREFERRED EMBODIMENT

Figure 1:
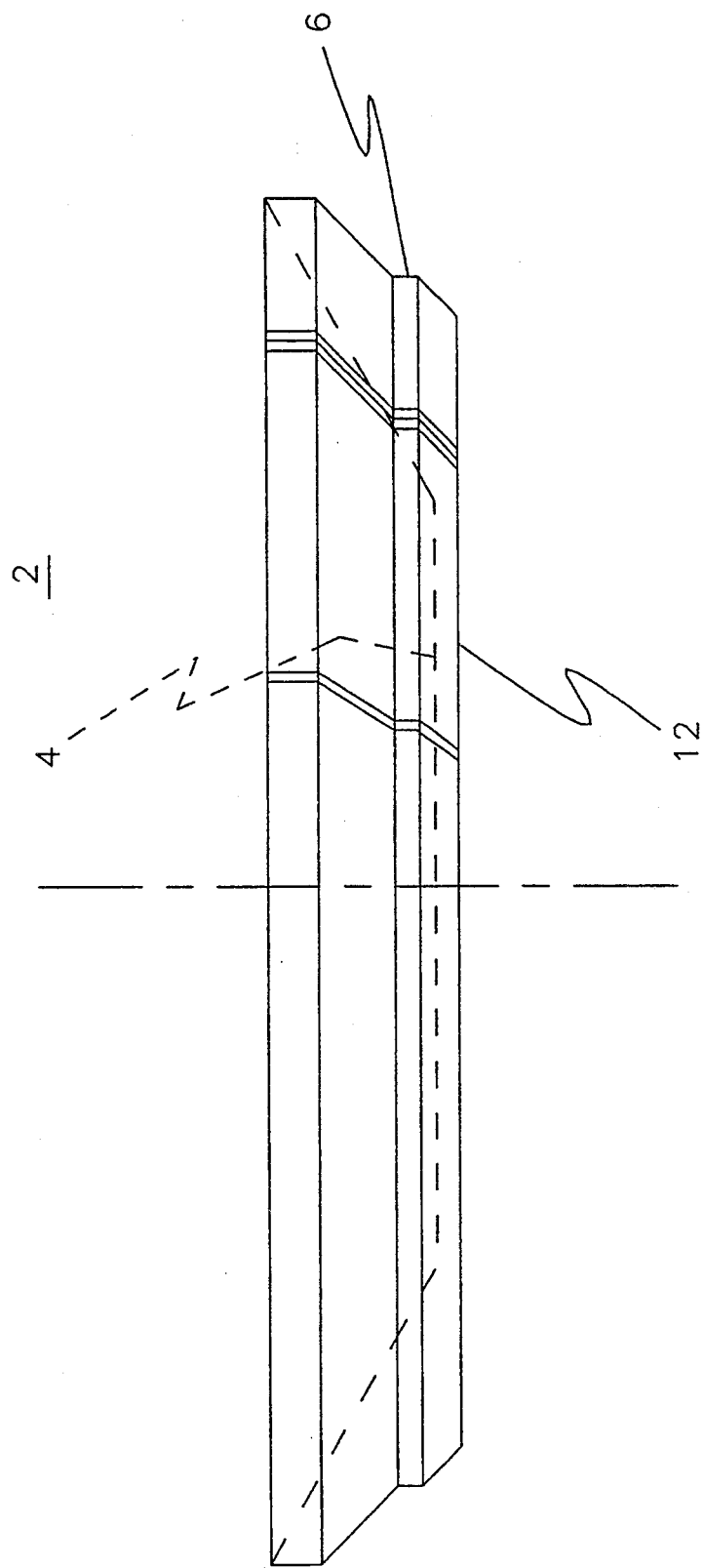
FIG. 1 is a side elevational view of a sputter target.

Turning now to FIG. 1 of the drawings, there is shown sputter target 2 having a concave face 4 (shown in phantom) from which the desired sputtering or coating material is ejected onto the desired substrate in accordance with conventional sputtering techniques. The target is circular in shape when viewed in plan view.

Annular sidewall 6 of the target is received in a cathodic sputter source of the types described in U.S. Pat. No. 4,385,979 or 4,457,825, herein incorporated by reference. As described in those patents, upon sputter usage, target 2 will expand radially due to thermal expansion until sidewall 6 contacts corresponding annular wall of a water or cooling jacket in which the target is mounted.

Figure 2:
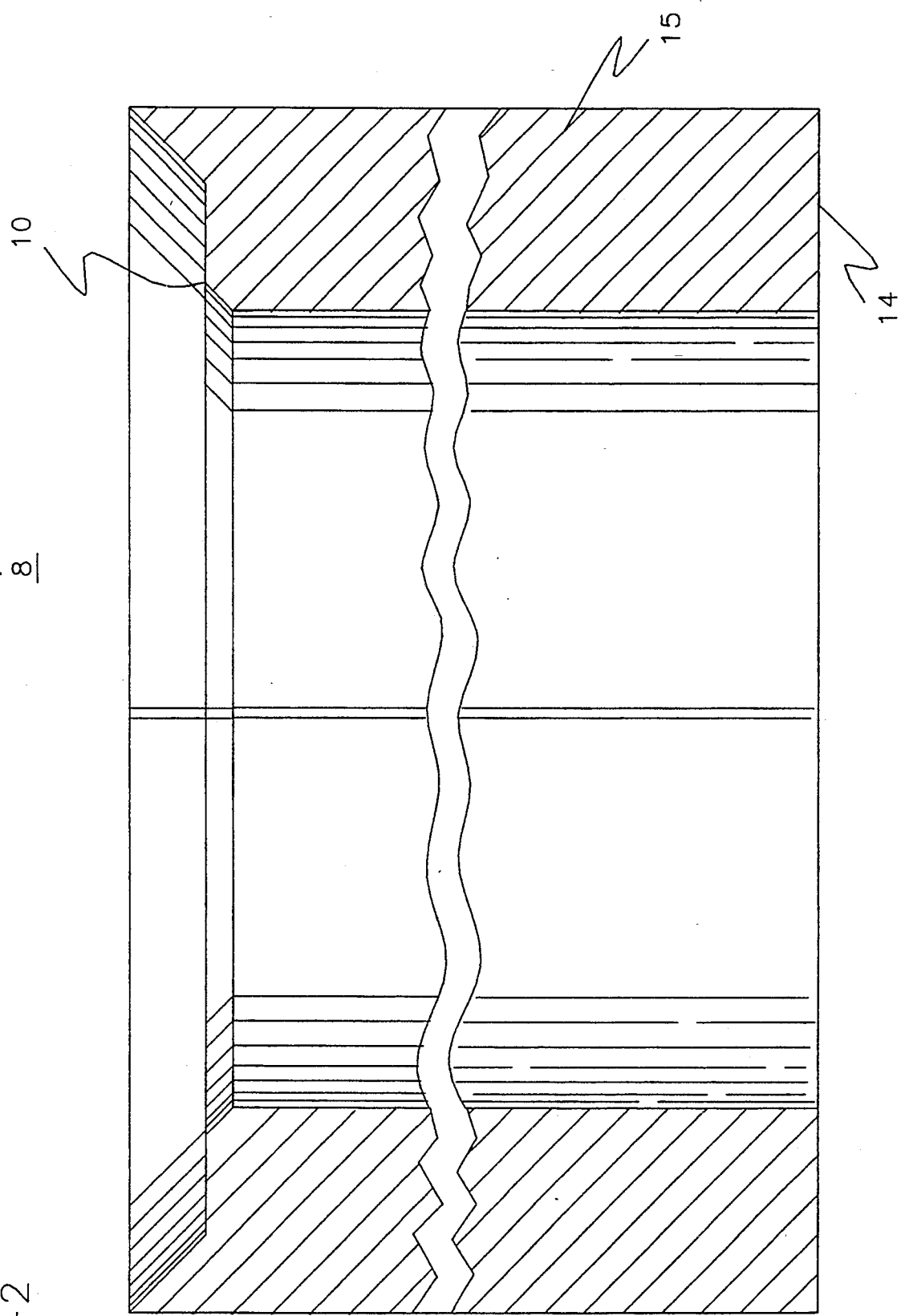
FIG. 2 is a longitudinal cross-sectional view of a backing plate which, in accordance with the invention, is to be friction welded to a target such as that shown in FIG. 1.

In FIG. 2, backing member 8 is shown having a face 10 that is profiled to mate with bottom side 12 (FIG. 1) of target 2. Annular sidewalls 15 terminate along bottom side 14 of the backing member.

Figure 4:
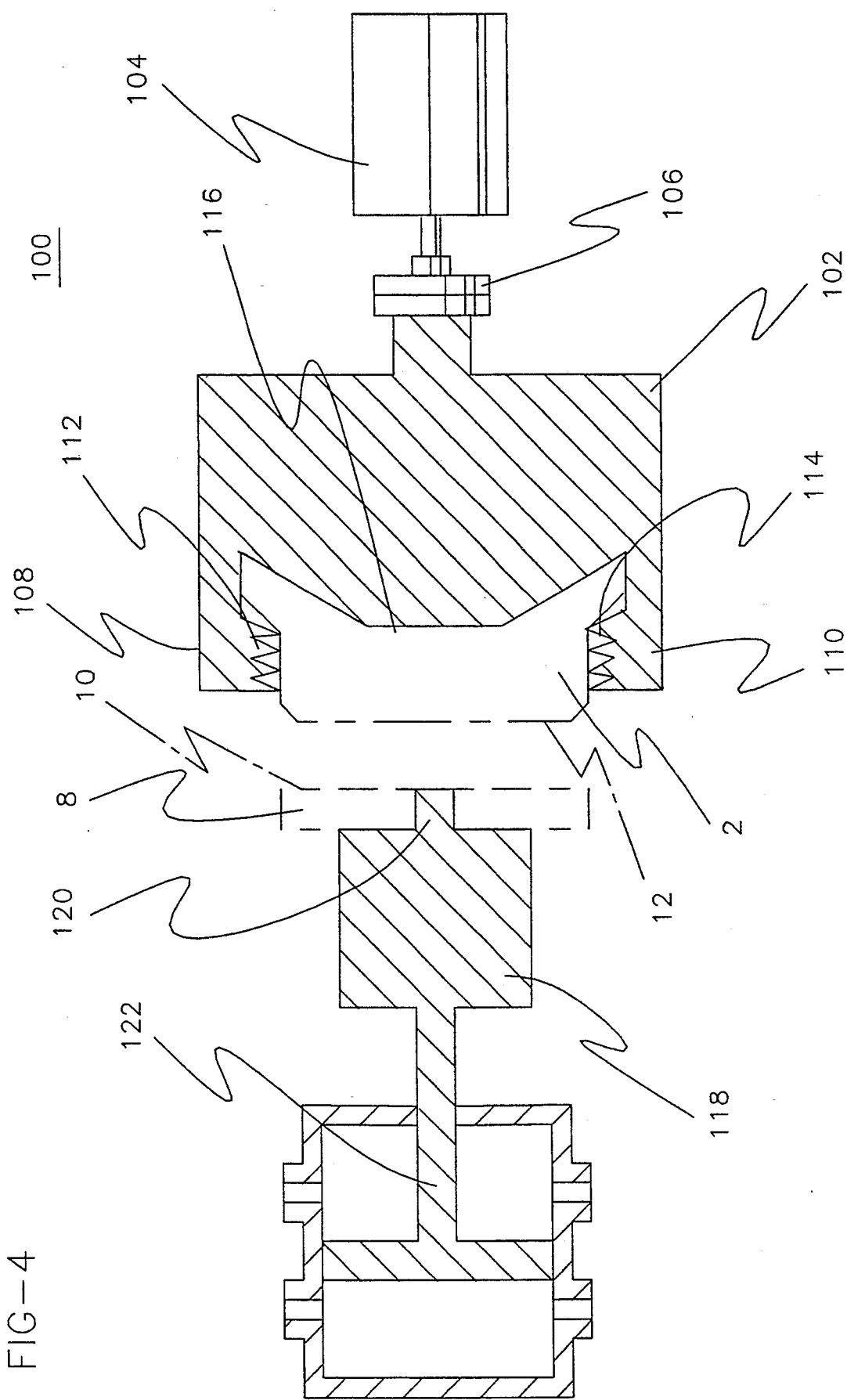
FIG. 4 is a schematic cross-sectional view of a friction welding apparatus used to weld the target to the backing plate.

Turning now to FIG. 4, there is shown a schematic representation of a friction welding machine that is utilized to weld backing member 8 to target 2 along the interface of face 10 of the backing plate and bottom side 12 of the target.

Friction welding machine 100 comprises motor driven collet 102 rotatably attached to motor 104 through flywheel assembly 106. Collet 102 is provided with opposed jaws 108, 110 provided with serrations 112, 114, respectively, to hold target 2 securely therein for high speed rotation. Backstop 116 prevents deformation of target 2 during the friction welding process.

Tailstock 118 comprising chuck 120 is adapted to securely receive backing plate 8 thereon. Pressure cylinder 122 actuates axial displacement of tailstock 118, fore and aft, toward and away from collet 102.

In accordance with the process, collet 102 carrying target 2 is rotated to an appropriate speed to provide sufficient inertial energy to make the weld. Then, the backing plate in the tailstock is forced against the rotating target with sufficient force so that the weld is made as the target in the collet is slowed to a stop. After removal of the friction welded target/backing plate assembly, the bottom side 14 of the backing plate is machined along wall 15 to the desired finished dimension.

Although any type of friction welding machine may be used or modified to accomplish the desired friction welding of the target to the backing plate, it is presently preferred to utilize a Model 250A Caterpillar inertia welder. This machine has a maximum spindle speed of 3500 RPM, maximum flywheel inertia of 1200 wK$^2$, and a maximum forging force of 175,000 lbs. The collet is a draw bar-type arrangement, with a 12-in. throat depth. The tailstock is an open configuration, allowing for infinite length parts up of 7" diameter to be welded.

The following are noted as being exemplary welding conditions:

|  |  | Preferred |
| --- | --- | --- |
| Surface Velocity of Collet | 1,000–3,000 sfm | 2,470 sfm |
| Total energy | 200,000–400,000 ft/lbs | 318,076 ft/lbs 1025 wK$^2$ |
| Welding Force | 30,000–70,000 lbs | 50,000 lbs |

-continued

|  |  | Preferred |
|---|---|---|
| Platen Displacement | 0.1–0.2 in. | 0.155 in. |

This invention is applicable to friction welding of any pure Al or Al alloy targets having less than or equal to 0.5% of alloying elements. One such commercially important target material is Al-30 ppm Si. Other common aluminum alloying elements include Mg and Cu. Pure Al and such alloys commonly have yield strengths of 5,000 psi or less; sometimes 1500 psi or less.

As to the backing plate 8, this can comprise any weldable Al alloy having a yield strength of about 20,000 psi or greater. Based upon commercial availability, it is presently preferred to use aluminum alloy AA No. 6061-T6. This particular alloy comprises Al; 0.40–0.8 Si, 0.7 Fe, 0.15–0.40 Cu; 0.15 Mn; 0.8–1.2 Mg; 0.04–0.35 Cr; 0.25 Zi; and 0.15 Ti. This alloy has a yield strength of about 40,000 psi.

EXAMPLES

In order to demonstrate the efficacy of the friction welded target/backing plate assembly of the invention cathodic sputtering tests were undertaken to demonstrate coated film uniformity and sputtering rate comparing the present friction welded target assemblies to monolithic targets.

Accordingly, Al-30 ppm Si/Al alloy 6061-T6 friction welded target/backing plates made in accordance with the preferred methods supra. (Target C) were compared to Al-30 ppm Si monolithic targets (Targets A and B).

The method used for testing the targets consisted of sputtering them in a Varian 3280 Sputtering System. This sputtering system is fitted with a standard Varian CMI sputtering source in station number three. The film uniformity from each target was determined by sputtering films onto silicon wafers and using a Prometrics Omnimap RS35C to measure the wafers. This instrument measures the sheet resistance in 49 locations on the wafer. The Omnimap produces a contour map and calculates the standard deviation. For this work we used a 125 mm diameter wafer with a 115 mm test surface diameter. This is a standard technique used by the Semiconductor industry for measuring film uniformity.

The test conditions used were:

| Backfill Pressure | 6 microns Ar |
|---|---|
| Power | 80% (96 KW) |
| Deposition time | 1 minute |
| Ramp | 3 seconds |
| Delay | 3 seconds |
| Substrate Temp. | None |

Run Procedure:
Standard running of cassettes of wafers (25 wafers per cassette). The 25th wafer of each cassette was measured for film uniformity. We also recorded the target voltage and current for this wafer.

DISCUSSION OF RESULTS (FIGS. 5 and 6)

Targets A and B, in FIGS. 5 and 6 represent a worse than typical and a better than typical Al-30 ppm Si monolithic target. Target C targets in accordance with the invention do not deform and become smaller (i.e., reducing heat transfer contact with the water jacket) during sputtering. Therefore, the uniformity of sputter coating deposition remains more constant as shown in FIG. 5 in comparison to Targets A and B. Moreover, the rate of deposition for Targets C remains nearly constant during the duration of sputtering as shown in FIG. 6.

Targets A and B deformed and became smaller during sputtering. They therefore ran hotter and sputtered at a lower rate with a less uniform film being produced.

Figure 3:
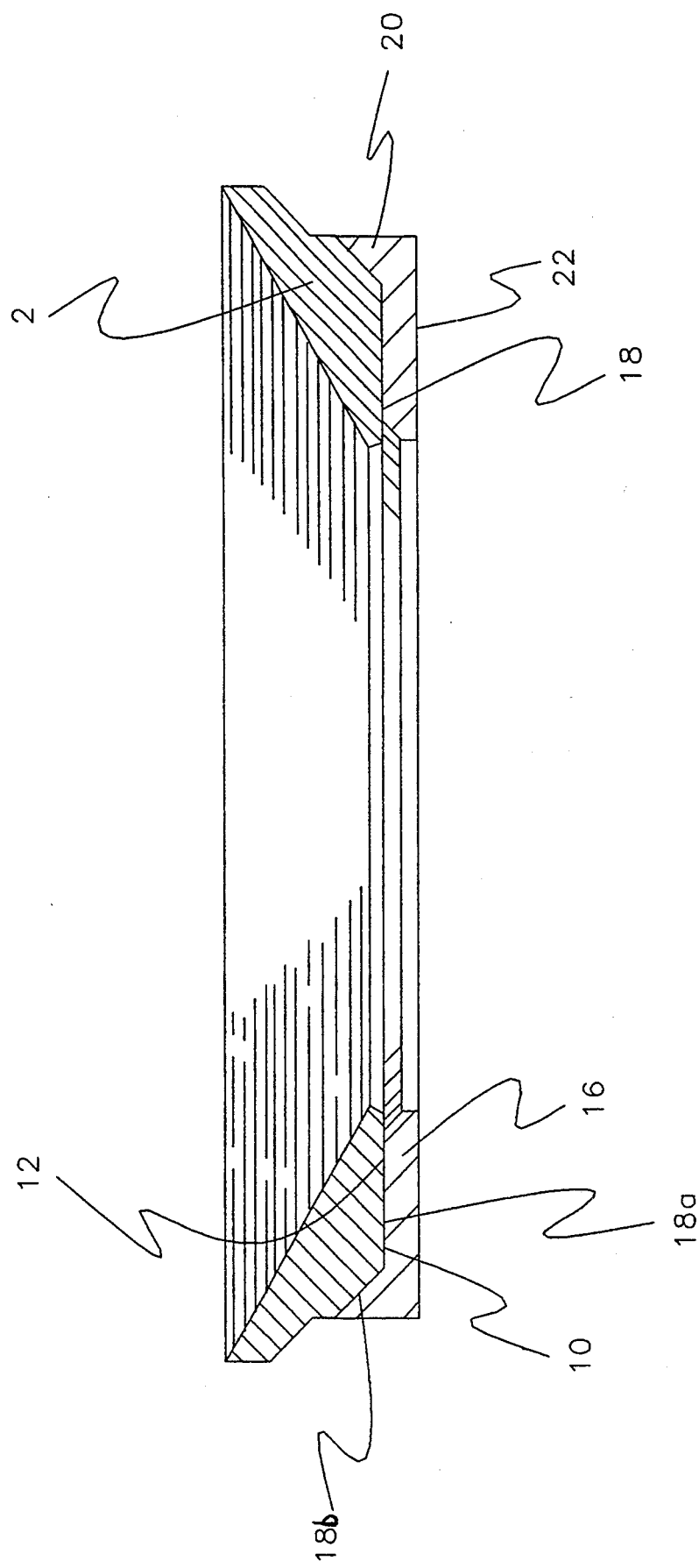
FIG. 3 is a longitudinal cross-sectional view of a target/retainer cup combination of the invention after a target such as that shown in FIG. 1 has been friction welded to a backing plate of the type shown in FIG. 2 and after a machining step has been performed to remove excess portions of the backing plate to form the retainer cup.

Turning now to FIG. 3 of the drawings, there is shown a finished target/backing plate assembly in accordance with the invention, ready for insertion into a sputter coating apparatus of the type shown in aforementioned U.S. Pat. Nos. 4,385,979 and 4,457,825. The friction welded assembly comprises target 2 and retaining member 16, which retaining member is the portion of backing member 8 remaining after the friction welding and machining steps (removal of excess backing member 8) have been performed. Retaining member 16 and target 2 are friction welded together along interface 18 defining a friction welded interfacial layer defined by bottom surface 12 of the target and face 10 of the backing plate.

Retaining member 16, as shown includes outer annular side wall member 20 connected to bottom annular, plate portion 22. The diameter of the assembly is dimensioned such that, at room temperatures, it will fit into the corresponding cylindrical water jacket of a cathodic sputtering apparatus with a slight clearance between wall member 20 and the water jacket walls. Upon sputter usage, thermal expansion of the assembly results in radial expansion of the target/retainer member thereby providing sufficient contact of wall member 20 with the water jacket to effect heat transfer. As shown, interface 18 is composed of a horizontal section 18a and an angled section 18b. In addition to friction welding of such horizontal and angular surfaces, curved surfaces can also be jointed in accordance with the invention.

While the form of the target/retaining member assembly and process for making same have been described in accordance with the preferred embodiment of this invention, it is to be understood that changes may be made in the assembly and/or process without departing from the scope of the invention which is defined in the appended claims.

What is claimed is:

1. Process for joining a sputter target to a backing plate member, comprising:
   a) providing a sputter target having a face side containing material to be sputter coated; and an opposite bottom side;
   b) providing a backing plate member having a face side and an opposed bottom side;
   c) friction welding said sputter target and said backing plate member along an interface defined by said bottom side of said target and said face side of said backing plate.

2. Process as recited in claim 1 further comprising removing portions of said bottom side of said backing plate to form a target/retainer assembly of desired dimension.

3. Process as recited in claim 2 wherein said target comprises aluminum or aluminum alloy having less than 0.5% alloying element or elements therein.

4. Process as recited in claim 3 wherein said target comprises Al-30 ppm Si.

5. Process as recited in claim 3 wherein said backing plate comprises Al alloy having a yield strength of 20,000 psi or greater.

6. Target assembly made in accordance with claim 3.

7. Process as recited in claim 2 wherein said step of removing portions of said bottom side of said backing plate comprises machining said backing plate.

8. Process as recited in claim 1 wherein said step of friction welding said target to said backing plate comprises rotating said target.

9. Process as recited in claim 8 comprising rotating said target at a surface velocity of about 1,000–3,000 sfm.

10. Process as recited in claim 9 comprising rotating said target at a surface velocity of about 2,500 sfm.

11. Process as recited in claim 10 wherein said target is held by a rotatable collet rotating at a total energy of 200,000–400,000 ft/lbs.

12. Process as recited in claim 11 wherein said friction welding further comprises mounting said backing plate in a tailstock, in coaxial relation with said collet and moving said backing plate into contact with said rotating target under an axially maintained pressure force of about 30,000–70,000 lbs.

13. Process as recited in claim 12 wherein said backing plate is aluminum alloy AA No. 6061-T6.

14. Target assembly made in accordance with claim 12.

15. Target assembly made in accordance with claim 1.

16. In a target assembly of the type wherein a disk-shaped target is provided with an annular side wall member of a sufficient height adapted for contacting a water jacket of a cathodic sputtering apparatus, a target face surface comprising coating material for sputtering, and a bottom side surface opposite from said target face surface, the improvement comprising a retaining member and a friction weld bonded layer interposed between said target and said retainer member and bonding said target bottom surface to said retainer member.

17. Target assembly as recited in claim 16 wherein said target is composed of pure Al or Al alloy having less than 0.5% of alloying element or elements therein, and having a yield strength of 5,000 psi or less.

18. Target assembly as recited in claim 17 wherein said retaining member is composed of aluminum alloy having a yield strength of 20,000 psi or greater.

19. Target assembly as recited in claim 18 wherein said retaining member has a yield strength of 40,000 psi or greater.

20. Target assembly as recited in claim 19 wherein said retaining member is aluminum alloy AA No. 6061-T6.

21. Target assembly as recited in claim 20 wherein said retainer member further comprises an annular wall member and a bottom, annular plate member connected to said wall member.

* * * * *